(12) United States Patent
Besinga et al.

(10) Patent No.: US 11,923,030 B2
(45) Date of Patent: *Mar. 5, 2024

(54) OPTIMIZED STORAGE CHARGE LOSS MANAGEMENT

(71) Applicant: Micron Technology, Inc., Boise, ID (US)

(72) Inventors: Gary F. Besinga, Boise, ID (US); Renato C. Padilla, Folsom, CA (US); Tawalin Opastrakoon, Boise, ID (US); Sampath K. Ratnam, San Jose, CA (US); Michael G. Miller, Boise, ID (US); Christopher M. Smitchger, Boise, ID (US); Vamsi Pavan Rayaprolu, Santa Clara, CA (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/888,641

(22) Filed: Aug. 16, 2022

(65) Prior Publication Data

US 2022/0392561 A1    Dec. 8, 2022

Related U.S. Application Data

(63) Continuation of application No. 17/212,531, filed on Mar. 25, 2021, now Pat. No. 11,456,051.

(51) Int. Cl.
G11C 29/44 (2006.01)
G11C 16/10 (2006.01)
G11C 16/26 (2006.01)
G11C 29/00 (2006.01)
G11C 29/42 (2006.01)
G11C 29/50 (2006.01)

(52) U.S. Cl.
CPC .............. *G11C 29/44* (2013.01); *G11C 16/10* (2013.01); *G11C 16/26* (2013.01); *G11C 29/42* (2013.01); *G11C 29/50004* (2013.01); *G11C 29/783* (2013.01)

(58) Field of Classification Search
CPC ......... G11C 16/10; G11C 16/26; G11C 29/44; G11C 29/42; G11C 29/50004; G11C 29/783

See application file for complete search history.

(56) References Cited

U.S. PATENT DOCUMENTS

2015/0205664 A1* 7/2015 Janik ................... G06F 11/1012
714/764

* cited by examiner

*Primary Examiner* — Alfredo Bermudez Lozada
(74) *Attorney, Agent, or Firm* — Lowenstein Sandler LLP

(57) ABSTRACT

A system includes a memory device and a processing device, operatively coupled with the memory device, to perform operations including initiating a read operation with respect to a block of the memory device, selecting, based on a set of criteria, a default read offset from a set of read offsets, wherein the set of criteria includes at least one of: a parameter related to trigger rate, or an amount of time that an open block is allowed to remain open to control threshold voltage shift due to storage charge loss, and applying the default read offset to a read operation performed with respect to the block.

20 Claims, 6 Drawing Sheets

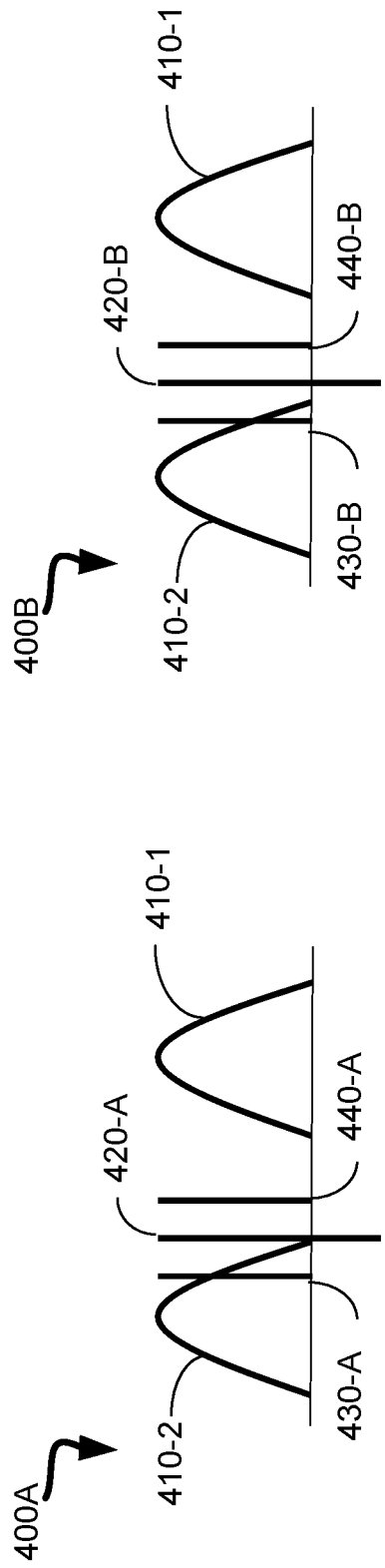
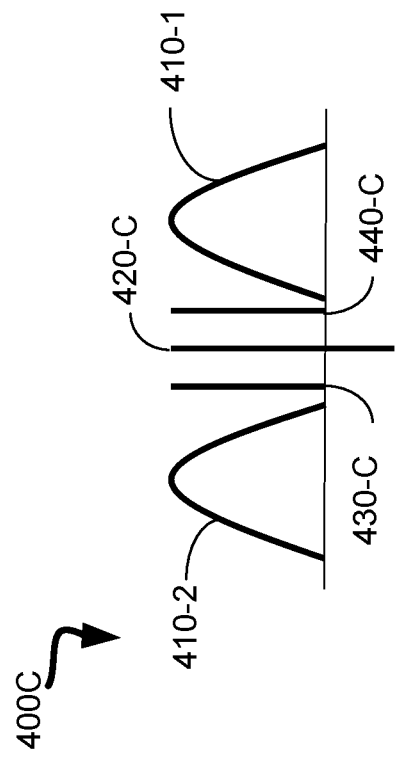

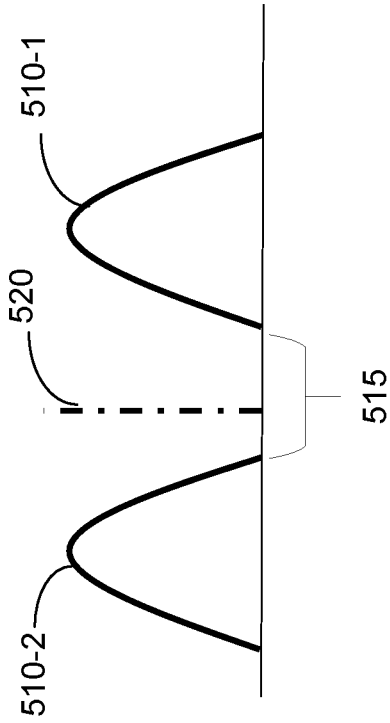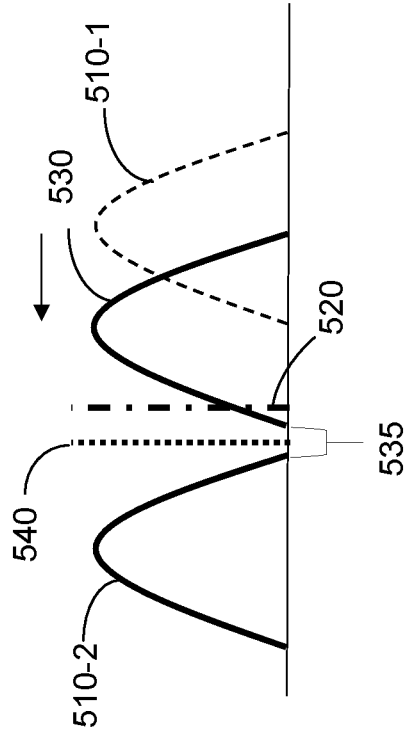

OPTIMIZED STORAGE CHARGE LOSS MANAGEMENT

RELATED APPLICATION

This application is a continuation of U.S. patent application Ser. No. 17/212,531, filed on Mar. 25, 2021 and entitled "OPTIMIZED STORAGE CHARGE LOSS MANAGEMENT," the entire contents of which are incorporated herein by reference.

TECHNICAL FIELD

Embodiments of the disclosure relate generally to memory sub-systems, and more specifically, relate to optimized storage charge loss (SCL) management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 4A-4C are diagrams illustrating read level centering with optimized SCL management in accordance with some embodiments of the present disclosure.

FIG. 5A is a diagram illustrating the use of a default read offset with respect to a threshold voltage ($V_t$) distribution in accordance with some embodiments of the present disclosure.

FIG. 5B is a diagram illustrating the use of a secondary read offset after the $V_t$ distribution shown in FIG. 5A has shifted over time in accordance with some embodiments of the present disclosure.

DETAILED DESCRIPTION

Figure 1:
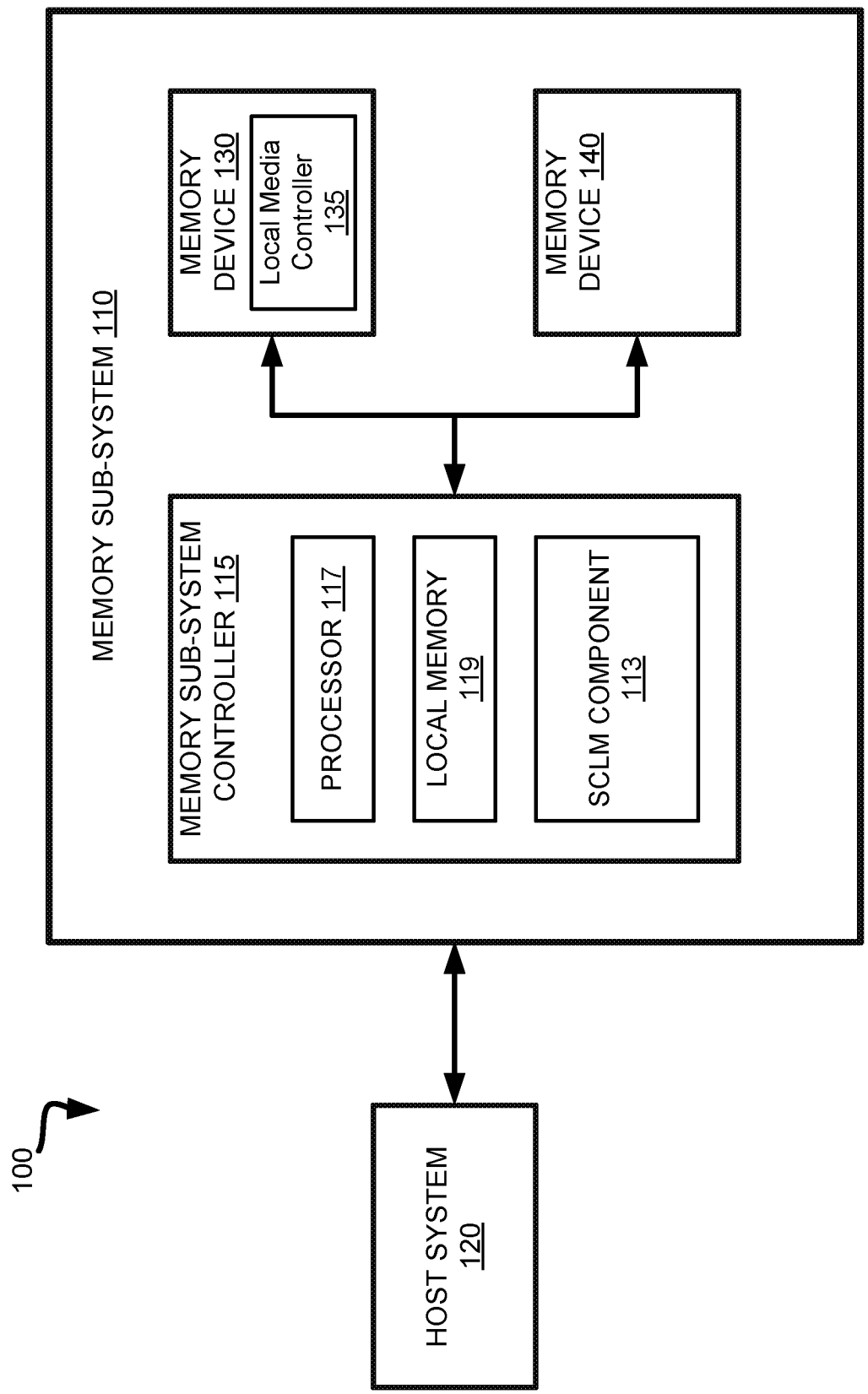
FIG. 1 illustrates an example computing system that includes a memory sub-system in accordance with some embodiments of the present disclosure.

Aspects of the present disclosure are directed to optimized storage charge loss (SCL) management. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus determining a voltage signal $V_{CG}$ that has to be applied to a control electrode or control gate of the cell to open the cell to the flow of electric current across the cell, between the source electrode and the drain electrode. More specifically, for each individual memory cell (having a charge Q stored thereon) there can be a threshold voltage $V_t$ such that the source-drain electric current is low for the control gate voltage ($V_{CG}$) being below the threshold voltage, $V_{CG} < V_t$. The current increases substantially once the control gate voltage has exceeded the threshold voltage, $V_{CG} > V_t$. Because the actual geometry of the electrodes and gates varies from cell to cell, the threshold voltages can be different even for cells programmed to the same logical value on the same die. The memory cells can, therefore, be characterized by a distribution P of the threshold voltages, $P(Q, V_t) = dW/dV_t$, where dW represents the probability that any given cell has its threshold voltage within the interval $[V_t, V_t + dV_t]$ when charge Q is placed on the cell.

A memory device can have distributions $P(Q, V_t)$ that are narrow compared with the working range of voltage windows tolerated by the cells of the device. Accordingly, multiple distributions $P(Q_k, V_t)$ (with "valleys" between distributions) can be fit into the working voltage window allowing storing and reliably detecting multiple bits per cell, such as $2^3=8$ distributions (7 valleys) for a TLC, $2^2=4$ distributions (3 valleys) for an MLC, etc. The distributions are interspersed with voltage intervals ("valley margins") between distributions where none (or very few) of the memory cells of the device have their threshold voltages. Such valley margins can, therefore, be used to separate various charge states $Q_k$—the logical state of the cell can be determined by detecting, during a read operation by applying read voltages corresponding to each valley. This effectively allows a single memory cell to store multiple bits of information: a memory cell operated with $2^N$ distributions ("levels") is capable of storing N bits of information. During the read operation, $2^{N-1}$ read voltages can be applied to distinguish the $2^N$ distributions. Specifically, the read operation can be performed by comparing the measured threshold voltage $V_t$ exhibited by the memory cell to one or more reference voltage levels corresponding to known valleys (e.g., centers of the valley) of the memory device One phenomenon observed in memory devices is storage charge loss or slow charge loss (SCL), also referred to herein as temporal voltage shift (TVS), in which $V_t$ distributions shift towards lower voltage levels as charge diminishes over, e.g., time and/or temperature. That is, the $V_t$ distribution shift can be proportional to the elapsed time from a programming operation to a read operation. With SCL, depending on the system workload, it is possible to have variations in the program-to-read elapsed time across different blocks. These variations can result in varying, non-uniform $V_t$ distribution shifts if programming is spaced significantly in time. As a result of these non-uniform $V_t$ distribution shifts, it can be difficult to determine or predict an optimal read level that can be applied to the majority of the blocks without compromising performance.

One method to address SCL is to assign a block to a block family of blocks, referred to herein as a bin, which groups together blocks that are programmed at or around the same time. Each bin is assigned a read offset, and the read offset is applied to the block to account for the predicted $V_t$ distribution shift over time resulting from SCL. Periodic scans determine if the read offset bin for a particular block needs to be updated to track the $V_t$ distribution shift.

Such a method, however, is not scalable to drives that may need a larger number of block families to track more blocks or block partitions (e.g., a block divided into sections), and the larger number of block families can require more system memory for tracking. For example, with respect to a zoned namespace (ZNS) memory sub-system, in which applications can interact with a controller to control data placement in respective zones that can be open indefinitely, this method can require close tracking compared to other memory sub-systems where block stripes are closed in a timely manner. If the number of bins is limited by system memory resources, higher error handling trigger rates and/or other performance issues can result due to wider variation of $V_t$ distribution shifts across blocks/partitions assigned to a read offset bin.

Aspects of the present disclosure address the above and other deficiencies by implementing optimized storage charge loss (SCL) management. For example, a memory sub-system can apply a set of read offsets to data reads by default. The set of read offsets can include one or more pre-characterized read offsets chosen for application to the majority of the blocks after programming without compromising performance. The set of read offsets can be determined from read voltage reference calibration performed during manufacturing. Accordingly, since the read offsets of the set of read offsets are fixed from the beginning, the memory sub-system need not perform any on-the-fly measurement or calculation of a read offset.

For example, the set of read offsets can include a default read offset. The default read offset is selected to gain SCL margin by pushing the read offset further "to the left" within a valley margin. The default read offset can be selected from a number of other (pre-characterized) read offsets based on one or more criteria to guarantee that all pages within a block will pass a decoder read. The default read offset can be configured based on age (e.g., age determined based on program/erase cycles).

The one or more criteria can include a trigger rate margin (TRM) threshold and a program-to-read (P2R) time (or time after programming (TAP) time duration) that an open block is allowed to remain open to control $V_t$ distribution shift due to SCL. As used herein, trigger rate refers to a rate of read retry due to the failure to decode during an initial read. The trigger rate (TR) can illustratively be calculated as $$TR = \frac{N}{T},$$

where N is the number of read fails and T is the total number of reads. As used herein, TRM refers to a buffer where the system can still perform without encountering read failure. For example, if the system can tolerate an error of 100 fail bits, then the read level setting can be set at the level where the number of fail bits is 50 or fewer bits, which corresponds to 50 bits of buffer (2× buffer or about 6 dB). For example, the default read offset can be selected as a read offset that can guarantee that all pages within a block will pass a decoder read meeting a given TRM threshold from an initial programming time to a given program-to-read (P2R) time duration threshold. Illustratively, the TRM threshold can be, e.g., about 6 dB and the P2R time duration threshold can be, e.g., about 10,000 minutes.

In some embodiments, the set of read offsets can further include a secondary read offset. The secondary read offset can be used as a "backup" read offset in place of the default read offset in certain situations (e.g., to avoid error handling until the block can be refreshed). For example, in a situation in which a block has been filled (e.g., fully programmed), the P2R time can be much longer than the given P2R time duration, and the secondary read offset can include an offset greater than the default read offset to address the corresponding $V_t$ distribution shift and corresponding SCL over time. For example, the default read offset may start to become invalid around a given P2R time duration of 10,000 minutes, and thus the secondary read offset should be triggered to replace the default read offset for blocks with a P2R time greater than 10,000 minutes.

Since the system may not be able to track the P2R time duration (e.g., time may not be tracked while the system is off), a switch from the default read offset to the secondary read offset can be triggered by a media module trigger. The switch from the default read offset to the secondary read offset can be triggered using any suitable media module trigger(s) in accordance with the embodiments described herein. Examples of suitable media module triggers include, but are not limited to, a media scan trigger (a subset of the full drive scan) to detect $V_t$ shift during media scan time, and an error handling trigger in the error handling flow.

For systems such as, e.g., ZNS systems that could potentially exceed over one million independent zones, the set of read offsets may not include a secondary read offset. In these cases, the host can be requested to refresh a zone in response to receiving a media scan trigger or an error handling trigger. Accordingly, in some embodiments, a single default read offset is used.

The method can be implemented with any suitable memory device architecture in accordance with the embodiments described herein. In one embodiment, the method can be implemented with a memory device implementing replacement gate NAND (RG NAND) technology. A replacement gate (RG) NAND device is a NAND device that implements a RG architecture rather than a floating gate (FG) architecture. The RG NAND architecture removes cell gaps that are typically found in FG NAND architectures, thereby reducing or eliminating capacitance resulting from those cell gaps. More specifically, the RG NAND architecture corresponds to a single-insulator structure. The RG NAND architecture can enable smaller size, improved read and write latency, and increase in transfer rate as compared to the FG NAND architecture.

Advantages of the present disclosure include, but are not limited to, improved scalability, reduced firmware complexity and reduced error handling trigger rates. Improved scalability can be achieved since the determination of two read level offsets for all blocks simplifies firmware implementation and reduces system memory requirements for tracking read levels per block. Reduced firmware complexity can be achieved by simplifying the tracking structure of the read offset per block. Reduced error handling trigger rates can be achieved as a media scan can more accurately determine the appropriate read offset bin.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a storage charge loss management (SCLM) component 113 that can optimize storage charge loss (SCL) management. The SCLM component 113 can receive a set of read offsets, select a read offset from the set of read offsets as a selected read offset based on one or more criteria, and assign the selected read offset to address SCL.

In some embodiments, the set of read offsets includes a default read offset. The default read offset can be configured based on age corresponding to program/erase cycles. The one or more criteria can include a trigger rate margin (TRM) threshold for a program-to-read (P2R) time duration that an open block is allowed to remain open to control $V_t$ distribution shift due to SCL.

In some embodiments, the set of read offsets includes a default read offset and a secondary read offset. Selecting the read offset can include determining that a block has been filled, and selecting the secondary read offset as the selected read offset in response to determining that the block has been filled. The secondary read offset can have a greater offset than the default read offset. Assigning the selected read offset can include triggering the secondary read offset using a media scan trigger or an error handling trigger. For example, triggering the secondary read offset using the media scan trigger can include detecting a $V_t$ distribution shift that crosses a shift threshold (determined to be greater than what the default read offset can support), and assigning the secondary read offset to a scanned block in response to detecting the $V_t$ distribution shift. Triggering the secondary read offset using the error handling trigger can include determining that an error recovery step matches a predetermined negative offset. If the error recovery step is larger than the predetermined negative offset, then the block will be queued for a refresh.

In some embodiments, the memory sub-system controller 115 includes at least a portion of the SCLM component 113.

In some embodiments, the SCLM component 113 is part of the host system 110, an application, or an operating system. In other embodiments, local media controller 135 includes at least a portion of SCLM component 113 and is configured to perform the functionality described herein. Further details regarding the operation of the SCLM component 113 are described below with reference to FIGS. 2 and 3.

Figure 2:
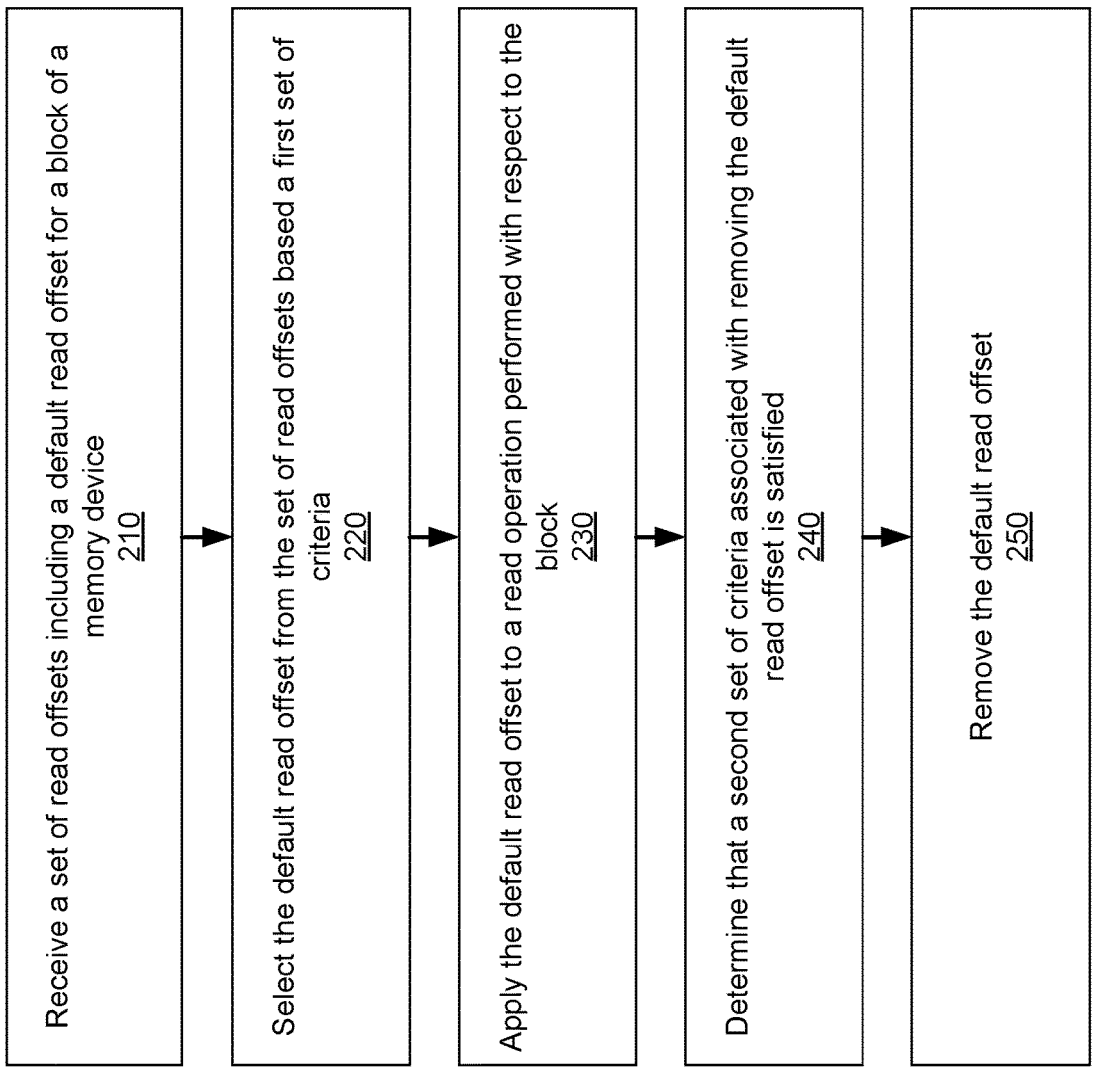
FIG. 2 is a flow diagram of a method to implement optimized storage charge loss (SCL) management in accordance with some embodiments of the present disclosure.

FIG. 2 is a flow diagram of an example method 200 to implement optimized storage charge loss (SCL) management in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the SCLM component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a set of read offsets including a default read offset for a block of a memory device. The default read offset can be used to guarantee that all pages within the block will pass a decoder read in view of the one or more criteria being met (e.g., TRM threshold and/or P2R time duration threshold). More specifically, the set of read offsets can include one or more pre-characterized read offsets determined prior to programming.

For example, the default read offset can be pre-characterized during a manufacturing test performed during the manufacturing stage. The manufacturing test can perform read offset centering (optimization) with optimized SCL management by determining a center (optimal) read offset, and then biasing the center read offset to account for the $V_t$ distribution shift resulting from SCL. For example, the center read offset can be a read level in which the raw bit error rate (RBER) is the smallest. The default read offset can be valid for a suitable number of program/erase (P/E) cycles. An illustrative example of performing read level centering with optimized SCL management will be described in further detail below with reference to FIGS. 4A-4C.

At operation 220, the processing logic selects the default read offset from the set of read offsets based on a first set of criteria. More specifically, the default read offset can be selected from a number of other (pre-characterized) read offsets based on the first set of criteria to guarantee that all pages within a block will pass a decoder read. The first set of criteria can include a trigger rate margin (TRM) threshold and/or a program-to-read (P2R) time duration that an open block is allowed to remain open to control $V_t$ distribution shift due to SCL. The default read offset can be selected to meet the TRM threshold, and can be required to be changed after a P2R time duration threshold. Illustratively, the TRM threshold can be, e.g., about 6 dB and the P2R time duration threshold can be, e.g., about 10,000 minutes.

At operation 230, the processing logic applies the default read offset to a read operation performed with respect the block. At operation 240, the processing logic determines that a second set of criteria associated with removing the default read offset is satisfied. The second set of criteria can include a criterion pertaining to a current P2R time duration of the block. More specifically, the criterion pertaining to the current P2R time duration of the block can be a determination that the current P2R time duration is greater than or equal to the P2R time duration threshold. For example, if the P2R time duration threshold is set to about 10,000 minutes, if the current P2R time duration is greater than or equal to 10,000 minutes, then the default read offset can be removed. Further details regarding operation 230 will be described below with reference to FIG. 3.

At operation 250, the processing logic can remove the default read offset. In some embodiments, removing the default read offset includes triggering a secondary read offset of the set of read offsets. The secondary read offset can be used as a "backup" read offset in place of the default read offset in certain situations (e.g., to avoid error handling until the block can be refreshed). For example, in a situation in which a block has been filled (e.g., fully programmed), the P2R time can be much longer than the given P2R time duration, and the secondary read offset can include an offset greater than the default read offset to address the corresponding $V_t$ distribution shift and corresponding SCL over time. For example, the default read offset may start to become invalid around a given P2R time duration of 10,000 minutes, and thus the secondary read offset should be triggered to replace the default read offset for blocks with a P2R time greater than 10,000 minutes. The secondary read offset can be selected to replace the default read offset until enough $V_t$ distribution shift has occurred to necessitate a reprogramming of data stored on the block (e.g., a refresh).

The secondary read offset can be set based on an offset value obtained from pre-characterized data during a development period. For example, samples can be grouped into one or more groups by various ages (which can determined from a metric such as P/E cycles), the behavior of $V_t$ distribution shift over time can be studied for each of the one or more groups, and a read offset value can be selected for use as the secondary read offset based on the $V_t$ distribution shift behavior.

The secondary read offset can be triggered using any suitable media module trigger(s) in accordance with the embodiments described herein. Examples of suitable media module triggers include, but are not limited to, a media scan trigger (a subset of the full drive scan) and an error handling trigger in the error handling flow.

In the case of a media scan trigger, an appropriate scan frequency can be selected to detect a $V_t$ distribution shift that crosses a threshold determined to be greater than what the default read offset can support. If the media scan detects that the $V_t$ distribution shift has exceeded the shift threshold, the secondary read offset will be assigned to the scanned block.

In the case of an error handling trigger, in response to determining an error using the default read offset (e.g., if the error recovery step matches a predetermined negative offset), the default read offset can be replaced by the secondary read offset. If the application of the secondary read offset is still resulting in an error, then the block can be queued for a refresh and the data will be reprogrammed somewhere else.

In other embodiments, a secondary read offset may not be included in the set of read offsets. Here, removing the default read offset can include initiating a refresh operation. This situation can occur in systems that could potentially exceed a sufficiently high number of zones, such as, e.g., ZNS systems. For example in a ZNS system that includes a sufficiently large number of zones (e.g., over one million zones), a host can be requested to refresh a zone of the ZNS system in response to receiving a media scan trigger or an error handling trigger. Further details regarding operations 210-250 will now be described below with reference to FIGS. 3 and 4A-4B.

Figure 3:
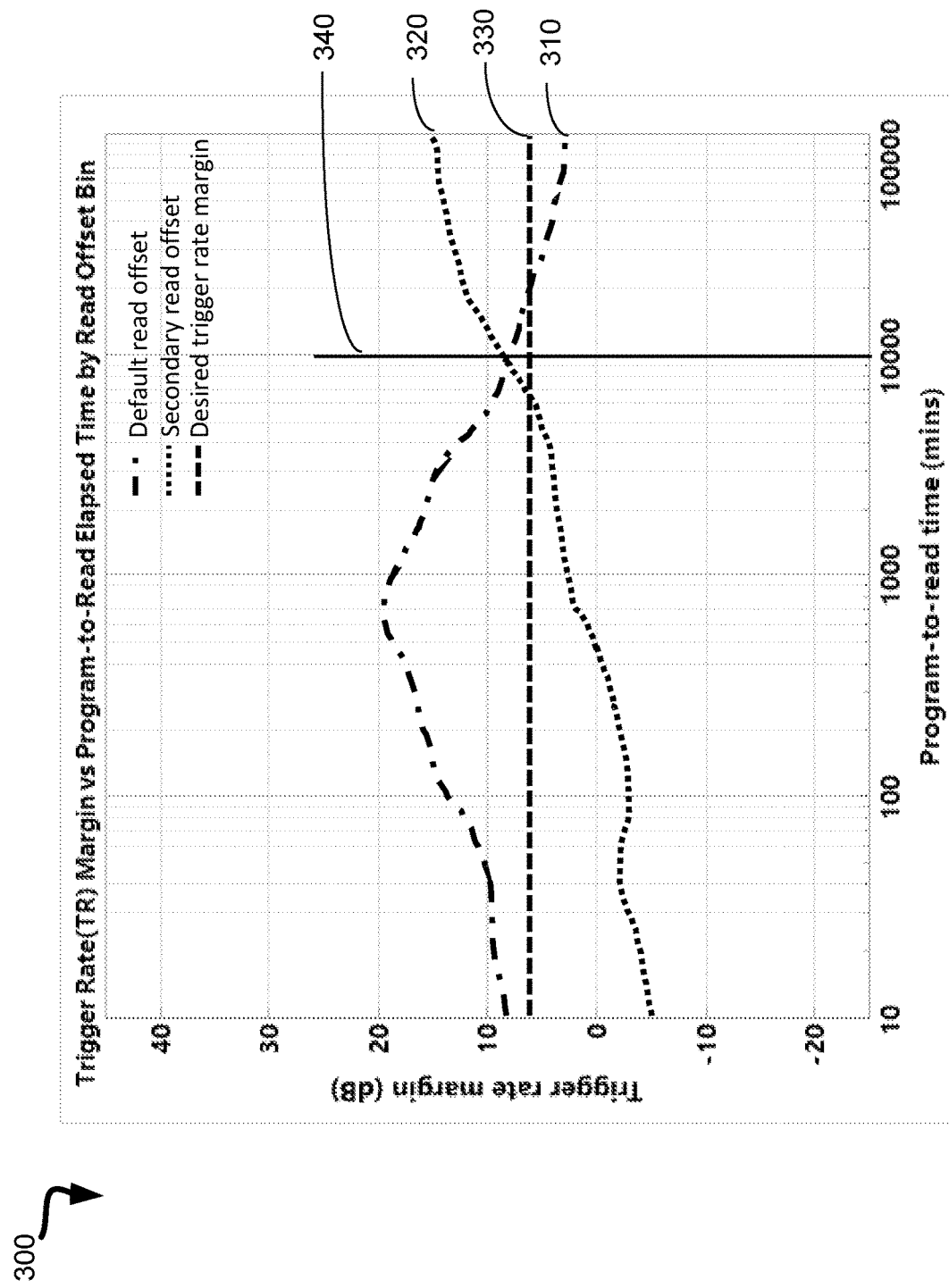
FIG. 3 is a graph illustrating trigger rate margin (TRM) versus elapsed program-to-read (P2R) time and a set of read offsets in accordance with some embodiments of the present disclosure.

FIG. 3 is a graph 300 illustrating trigger rate margin (TRM) versus elapsed program-to-read (P2R) time and a set of read offsets in accordance with some embodiments of the present disclosure. It is assumed that the set of read offsets includes a default read offset and a secondary read offset.

More specifically, the graph 300 has an x-axis labeled "Program-to-read time (mins)" and a y-axis labeled "Trigger rate margin (dB)." As shown, line 310 corresponding to trigger rate margin (TRM) over program-to-read (P2R) time for a default read offset, and a line 320 corresponding to TRM over P2R for a secondary read offset are plotted. The P2R time labeled on the x-axis is illustrated on a logarithmic scale.

As further shown, a dashed line 330 corresponding to a desired TRM is drawn. In this illustrative example, the desired TRM is about 6 dB. TRM values below the desired TRM value indicated by the line 330 can result in read errors. The line 310 is above the desired TRM 330 at least from a P2R time of about 10 minutes to a P2R time of about 20,000 minutes, where the line 310 intersects the desired TRM 330. Moreover, the line 320 is below the desired TRM 330 at least from a P2R time of about 10 minutes to a P2R time of about 7,000 minutes.

The lines 310 and 320 intersect at what is referred to as a threshold P2R time, which is indicated by line 340. In this illustrative example, the threshold P2R time is about 10,000 minutes. Since the line 310 is decreasing while the line 320 is increasing after the intersection at the threshold P2R time (e.g., about 10,000 minutes), the default read offset will ideally be switched with secondary read offset starting from threshold P2R time. However, as mentioned above, the switch is triggered based on results of media scan and/or error handling.

FIGS. 4A-4C are diagrams 400A-400C illustrating the performance of read level centering with optimized SCL management in accordance with some embodiments of the present disclosure. For example, the read level centering shown in FIGS. 4A-4C can be implemented within the method 200 of FIG. 2 to determine a default read offset for implementing optimized SCL management.

More specifically, in FIG. 4A, diagram 400A depicts a first loop of the read level centering process including $V_t$ distributions 410-1 and 410-2. As shown, a first set of read offsets for the first loop is provided. The first set of read offsets for the first loop includes a center read offset 420-A, a left read offset 430-A and a right read offset 440-A. The center read offset 420-A corresponds to a default read offset for the memory device. The left read offset 430-A and the right read offset 440-A can be determined relative to the center read offset 420-A. For example, the left read offset can be equal to the center read offset 420-A minus a first predetermined value, and the right read offset 440-A can be equal to the center read offset 420-B plus a second predetermined value, where each of the first and second predetermined values is a positive value. Alternatively, the left read offset can be equal to the center read offset 420-A plus a first predetermined value, and the right read offset 440-A can be equal to the center read offset 420-B minus a second predetermined value, where each of the first and second predetermined values is a negative value. The first and second predetermined values can be determined through experimentation and/or by applying automatic gain control. For example, the first and second predetermined values can each range between, e.g., +/−10 mV relative to the valley width. In some embodiments, the first and second predetermined values are the same value.

During sampling, a raw bit error rate (RBER) corresponding to the left read offset 430-A (LeftRBER$_A$) is determined to be greater than or equal to an RBER corresponding to the right read offset 440-A (RightRBER$_A$) plus some precharacterized bias RBER value associated with SCL (SCLBiasRBER). That is, LeftRBER$_A$≥RightRBER$_A$+SCLBiasRBER. A first new offset can then be calculated to shift each read offset of the first set of read offsets to the right during the next sampling. The SCLBiasRBER can be determined through experimentation. More specifically, the SCLBiasRBER can be a value that can range from, e.g., a Random Telegraph Noise (RTN) floor to some error correction code (ECC) correction capability. For example, the RTN floor can be about 10 bits, and the ECC correction capability can be about 1% of the sample bits.

In FIG. 4B, diagram 400B depicts the second loop of the read level centering process. As shown, each read offset of the first set of read offsets is shifted by the first new offset described above to obtain a second set of read offsets including a center read offset 420-B, a left read offset 430-B and a right read offset 440-B. During sampling, an RBER corresponding to the left read offset 430-B (LeftRBER$_B$) is determined to be greater than or equal to an RBER corresponding to the right read offset 440-B (RightRBER$_B$) plus SCLBiasRBER. That is, similar to FIG. 4A, LeftRBER$_B$≥RightRBER$_B$+SCLBiasRBER. A second new offset can then be calculated to shift each read offset of the second set of read offsets to the right during the next sampling.

In FIG. 4C, diagram 400C depicts the third loop of the read level centering process. As shown, each read offset of the second set of read offsets is shifted by the second new offset described above to obtain a third set of read offsets including a center read offset 420-C, a left read offset 430-C and a right read offset 440-C. During sampling, an RBER corresponding to the left read offset 430-C (LeftRBER$_C$) is determined to be less than an RBER corresponding to the right read offset 440-C(RightRBER$_C$) plus SCLBiasRBER. That is, LeftRBER$_C$<RightRBER$_C$+SCLBiasRBER. A third new offset can then be calculated to shift each read offset of the second set of read offsets to the left during the next sampling.

The shift to the left after the third loop can cause the process to move between the second loop shown in diagram 400B and the third loop shown in diagram 400C. Eventually, the process can yield a final center read offset corresponding to a lowest RBER. More specifically, in this example, the center read offset 420-B can be identified as the optimal center read offset for use as a default read offset.

FIG. 5A is a diagram 500A illustrating $V_t$ distributions at in accordance with some embodiments of the present disclosure. For example, the diagram 500A can illustrate $V_t$ distributions at an initial programming time. As shown, the diagram 500A depicts $V_t$ distributions 510-1 and 510-2 separated by a valley 515. A default read offset 520 is placed within the valley 515. More specifically, the default read offset 520 can be placed left of center of the valley 515 to give extra margin for when the $V_t$ distribution 510-1 shifts to the left over time, as will be described below with reference to FIG. 5B.

FIG. 5B is a diagram 500B illustrating a shift of the $V_t$ distributions shown in FIG. 5A, in accordance with some embodiments of the present disclosure. More specifically, the diagram 500B shows a leftward shift of the $V_t$ distribution 510-1 to a $V_t$ distribution 530 resulting from SCL after some P2R time. The $V_t$ distribution 530 is separated from the $V_t$ distribution 510-2 by a valley 535, which is smaller than the valley 515 in this example. A secondary read offset 540 is placed within the valley 535. More specifically, similar to the default read offset 520, the secondary read offset 540 can be placed left of center of the valley 535 to give extra margin for when the $V_t$ distribution 530 shifts to the left over time. Accordingly, the P2R time is a time greater than or equal to a threshold P2R time, as described above with reference to FIGS. 2-3.

Figure 6:
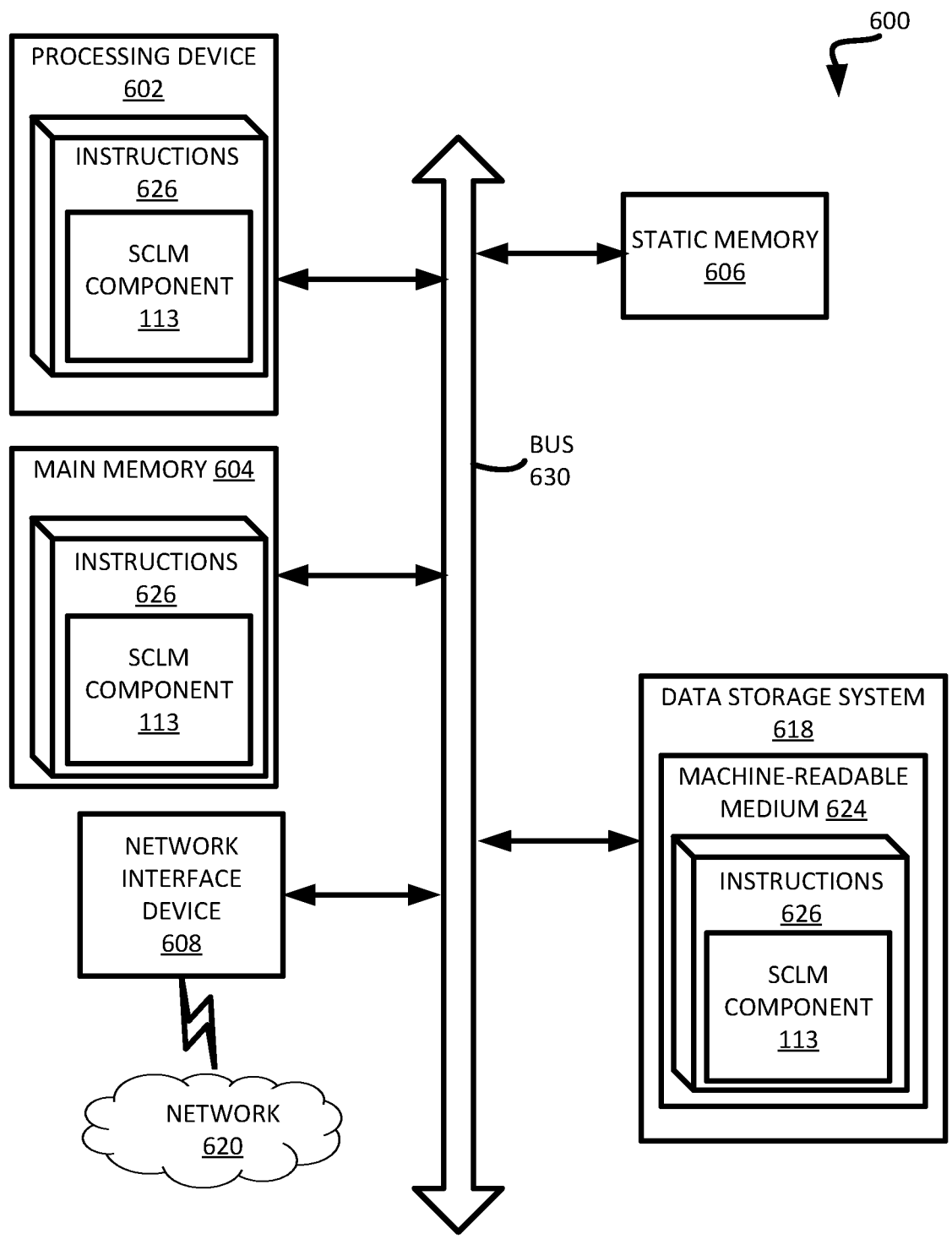
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the SCLM component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a SCLM component (e.g., the SCLM component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device;
a processing device operatively coupled with the memory device; and
a memory operatively coupled with the processing device and storing instructions that, when executed by the processing device, cause the processing device to perform operations comprising:
initiating a read operation with respect to a block of the memory device;
selecting, based on a set of criteria, a default read offset from a set of read offsets, wherein the set of criteria comprises at least one of: a parameter related to trigger rate, or an amount of time that an open block is allowed to remain open to control threshold voltage shift due to storage charge loss; and
applying the default read offset to perform the read operation.

2. The system of claim 1, wherein the default read offset is pre-characterized during a manufacturing test.

3. The system of claim 1, wherein the set of criteria comprises a trigger rate margin threshold and a program-to-read time duration that an open block is allowed to remain open to control threshold voltage shift due to storage charge loss.

4. The system of claim 1, wherein the operations further comprise:
determining whether a second set of criteria associated with removing the default read offset is satisfied, the second set of criteria comprising a criterion pertaining to a current program-to-read time duration of the block; and
responsive to determining that the second set of criteria is satisfied, removing the default read offset.

5. The system of claim 4, wherein the set of read offsets further comprises a secondary read offset having a greater magnitude than the default read offset, and wherein removing the default read offset comprises replacing the default read offset with the secondary read offset.

6. The system of claim 5, wherein removing the default read offset comprises triggering the secondary read offset using at least one of: a media scan trigger or an error handling trigger.

7. The system of claim 4, wherein removing the default read offset comprises initiating a refresh operation.

8. A method comprising:
initiating, by a processing device, a read operation with respect to a block of a memory device;
selecting, by the processing device based on a set of criteria, a default read offset from a set of read offsets, wherein the set of criteria comprises at least one of: a parameter related to trigger rate, or an amount of time that an open block is allowed to remain open to control threshold voltage shift due to storage charge loss; and
applying, by the processing device, the default read offset to a read operation performed with respect to the block.

9. The method of claim 8, wherein the default read offset is pre-characterized during a manufacturing test.

10. The method of claim 9, wherein the set of read offsets further comprises a secondary read offset having a greater magnitude than the default read offset, and wherein removing the default read offset comprises replacing the default read offset with the secondary read offset.

11. The method of claim 10, wherein removing the default read offset comprises triggering the secondary read offset using at least one of: a media scan trigger or an error handling trigger.

12. The method of claim 8, wherein the set of criteria comprises a trigger rate margin threshold and a program-to-read time duration that an open block is allowed to remain open to control threshold voltage shift due to storage charge loss.

13. The method of claim 8, further comprising:
determining whether a second set of criteria associated with removing the default read offset is satisfied, the second set of criteria comprising a criterion pertaining to a current program-to-read time duration of the block; and
responsive to determining that the second set of criteria is satisfied, removing the default read offset.

14. The method of claim 13, wherein removing the default read offset comprises initiating a refresh operation.

15. A non-transitory computer-readable storage medium comprising instructions that, when executed by a processing device, cause the processing device to perform operations comprising:
initiating a read operation with respect to a block of a memory device;
selecting, based on a set of criteria, a default read offset from a set of read offsets, wherein the set of criteria comprises at least one of: a parameter related to trigger rate, or an amount of time that an open block is allowed to remain open to control threshold voltage shift due to storage charge loss; and
applying the default read offset to perform the read operation.

16. The non-transitory computer-readable storage medium of claim 15, wherein the default read offset is pre-characterized during a manufacturing test.

17. The non-transitory computer-readable storage medium of claim 15, wherein the set of criteria comprises a trigger rate margin threshold and a program-to-read time duration that an open block is allowed to remain open to control threshold voltage shift due to storage charge loss.

18. The non-transitory computer-readable storage medium of claim 15, wherein the operations further comprise:
- determining whether a second set of criteria associated with removing the default read offset is satisfied, the second set of criteria comprising a criterion pertaining to a current program-to-read time duration of the block; and
- responsive to determining that the second set of criteria is satisfied, removing the default read offset.

19. The non-transitory computer-readable storage medium of claim 18, wherein the set of read offsets further comprises a secondary read offset having a greater magnitude than the default read offset, and wherein removing the default read offset comprises replacing the default read offset with the secondary read offset.

20. The non-transitory computer-readable storage medium of claim 19, wherein removing the default read offset comprises triggering the secondary read offset using at least one of: a media scan trigger or an error handling trigger.

\* \* \* \* \*